United States Patent
Park et al.

(10) Patent No.: US 11,201,502 B1
(45) Date of Patent: Dec. 14, 2021

(54) HYBRID WIRELESS POWER TRANSFER SYSTEM FOR AN ELECTRONIC DEVICE

(71) Applicant: NXP USA, Inc., Austin, TX (US)

(72) Inventors: Jaehee Park, Austin, TX (US); Ivan Sieklik, Martin (SK)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/902,495

(22) Filed: Jun. 16, 2020

(51) Int. Cl.
| | |
|---|---|
| H02J 50/10 | (2016.01) |
| H01F 27/28 | (2006.01) |
| H02J 50/60 | (2016.01) |
| H02J 50/40 | (2016.01) |
| H02J 50/00 | (2016.01) |
| H02J 50/90 | (2016.01) |
| H02J 50/80 | (2016.01) |
| H01F 38/14 | (2006.01) |

(52) U.S. Cl.
CPC .......... *H02J 50/10* (2016.02); *H01F 27/2804* (2013.01); *H01F 38/14* (2013.01); *H02J 50/005* (2020.01); *H02J 50/402* (2020.01); *H02J 50/60* (2016.02); *H02J 50/80* (2016.02); *H02J 50/90* (2016.02)

(58) Field of Classification Search
CPC .......... H02J 50/402; H02J 50/10; H02J 50/12; H02J 5/005; H02J 50/40; H02J 50/80; H02J 50/90; H01F 38/14; H01F 5/003; H01F 5/06; H01F 27/2804; H01F 27/2809; H01F 27/2866; H01F 2027/2814
See application file for complete search history.

(56) References Cited

U.S. PATENT DOCUMENTS

| | | | |
|---|---|---|---|
| 9,143,000 B2 | 9/2015 | Leabman et al. | |
| 9,356,659 B2 | 5/2016 | Partovi | |
| 9,711,278 B2 | 7/2017 | Park et al. | |
| 9,899,147 B2 * | 2/2018 | Leem | H01F 27/2885 |
| 10,277,043 B2 * | 4/2019 | Graham | H04B 5/0075 |

(Continued)

FOREIGN PATENT DOCUMENTS

WO    2014109460 A1    7/2014

OTHER PUBLICATIONS

Villas-Boas, Antonio, "Apple came up with a clever new idea that could be the future of wireless charging," downloaded Jun. 12, 2020 from https://www.businessinsider.com/apple-wireless-charging-patent-ditches-charging-pad-2019-3, 11 pages.

(Continued)

*Primary Examiner* — Ryan Johnson

(57) ABSTRACT

A respective first signal is applied to a first terminal of each of one or more litz coils and each of one or more printed circuit board (PCB) coils. A respective second signal is received from a second terminal associated with each of the one or more litz coils and the one or more PCB coils. The respective second signal is based on the respective first signal applied to the first terminal of each of one or more litz coils and each of one or more PCB coils. A coil is selected from the one or more litz coils and the one or more PCB coils where the selected coil is based on the respective second signal from the second terminal associated with each of the one or more litz coils and the one or more PCB coils to wirelessly transfer the power to an electronic device.

19 Claims, 9 Drawing Sheets

(56) References Cited

U.S. PATENT DOCUMENTS

| | | | |
|---|---|---|---|
| 2009/0096413 A1* | 4/2009 | Partovi | H02J 50/12 |
| | | | 320/108 |
| 2017/0250574 A1 | 8/2017 | Min et al. | |
| 2018/0090956 A1 | 3/2018 | Graham et al. | |
| 2018/0131243 A1 | 5/2018 | Hamaguchi et al. | |
| 2018/0358168 A1 | 12/2018 | Furiya et al. | |
| 2019/0097448 A1* | 3/2019 | Partovi | H01F 38/14 |
| 2019/0190320 A1 | 9/2019 | Park | |
| 2020/0036229 A1 | 1/2020 | Pinciuc et al. | |

OTHER PUBLICATIONS

Idapt, "Best 3 in 1 Charging Stations to Charge Multiple Devices," downloaded Jun. 12, 2020 from https://www.idaptweb.com/3-in-1-wireless-chargers/, 42 pages.

* cited by examiner

HYBRID WIRELESS POWER TRANSFER SYSTEM FOR AN ELECTRONIC DEVICE

FIELD OF USE

This disclosure generally relates to a hybrid wireless power transfer system, and more particularly to a wireless power transfer system with at least two types of coils such as printed circuit board (PCB) coils and litz wire coils to wirelessly transfer power to an electronic device.

BACKGROUND

A wireless power transfer system wirelessly transfers power to an electronic device such as a handheld wireless phone or a wearable device. The power is transferred to facilitate charging a battery of the electronic device or to operate the electronic device.

Figure 1:
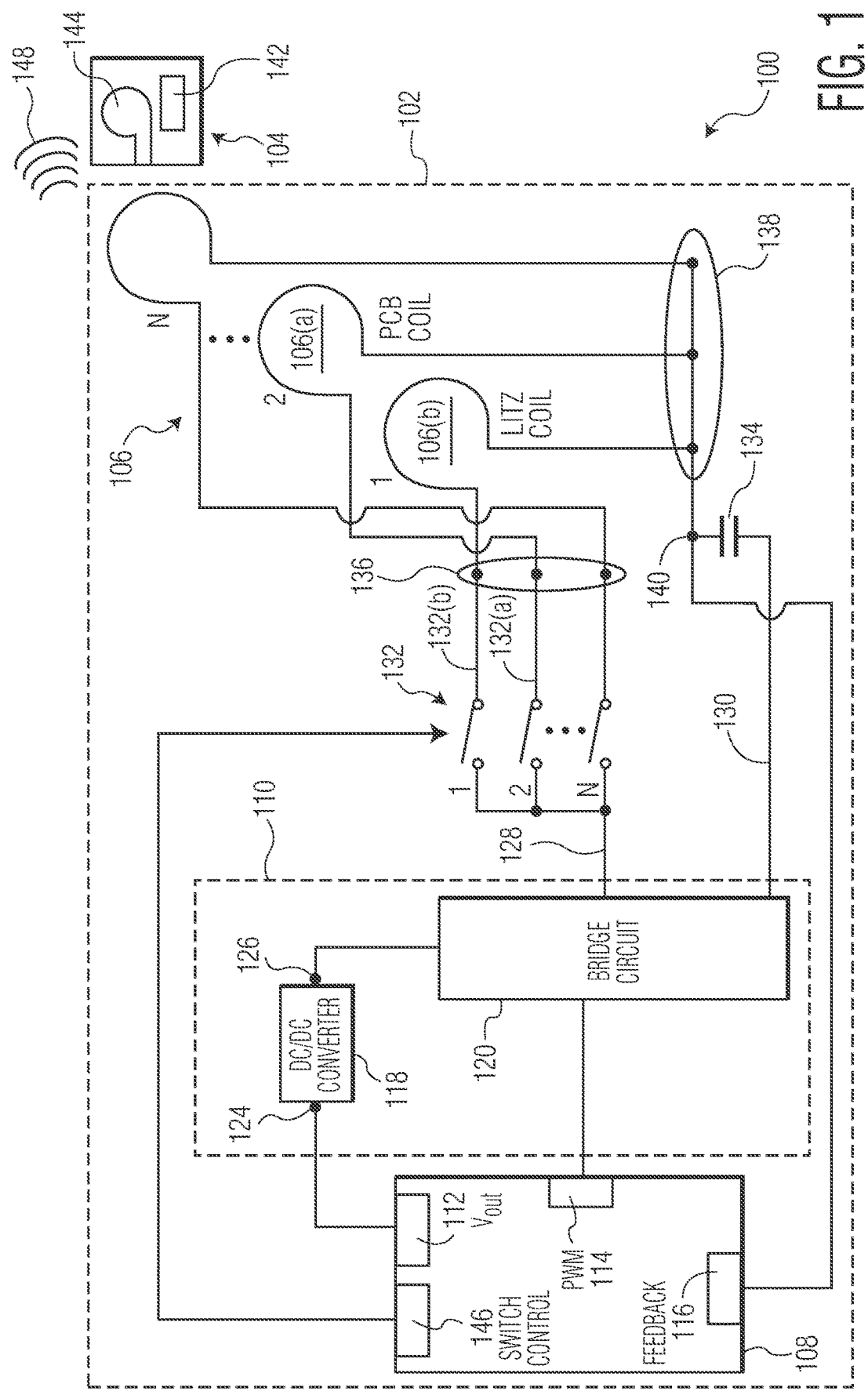
FIG. 1 is an example block diagram of a wireless power transfer system to wirelessly transfer power to an electronic device.

The drawings are for the purpose of illustrating example embodiments, but it is understood that the embodiments are not limited to the arrangements and instrumentality shown in the drawings.

DETAILED DESCRIPTION

The description that follows includes example systems, methods, techniques, and program flows for a wireless power transfer system, and more particularly for a wireless power transfer system having different types of coils to wirelessly transfer power to an electronic device such as a handheld wireless phone or a wearable device. A respective first signal is applied to a first terminal of each of one or more litz coils and each of one or more printed circuit board (PCB) coils to cause a respective second signal to be received from a second terminal associated with each of the one or more litz coils and the one or more PCB coils. Based on the respective second signal associated with each of the one or more litz coils and the one or more PCB coils, a PCB coil or litz coil is selected to wirelessly transfer power to the electronic device. In examples, the selected coil has a respective second signal which is less than a voltage threshold and the respective first signal applied to the selected coil generates a signal strength at a coil of the electronic device that exceeds a signal strength threshold. Well known instructions, protocols, structures, and techniques have not been shown in detail in order not to obfuscate the description.

Example System

FIG. 1 is an example block diagram of a wireless power transfer system 100 to wirelessly transfer power from a transmitter pad 102 to an electronic device 104. The transmitter pad 102 may transfer the power to the electronic device 104 based on inductive principles and the electronic device 104 may take the form of a handheld wireless phone, a wearable device (e.g., watch, glasses, fitness tracker, sleeping monitor), or other type of device. The transferred power may be used to operate the electronic device 104. Additionally or alternatively, the transferred power may be used to charge a battery 142 of the electronic device 104.

The transmitter pad 102 may have two or more coils 106 identified by a number 1 to N (where N>1) and the electronic device 104 may have one or more receiver coils 144. In examples, one or more of the coils 106 may be arranged to generate a magnetic field 148 which resonates at a resonant frequency. The magnetic field couples with the one or more receiver coils 144 and induces a voltage in the one or more coils 144 of the electronic device 104 to wirelessly transfer power from the transmitter pad 102 to the electronic device 104.

The transmitter pad 102 may use two or more types of coils 106 to transfer power. Each type of coil may transfer power based on a respective power transfer technology. The power transfer technology may be either printed circuit board (PCB) coils for transferring power or a multistrand coil such as litz coils for transferring power. An example of the PCB coils is represented as PCB coil 106(a) and an example of the litz coils is represented as litz coil 106(b). The PCB coil 106(a) may be a conductive trace on a PCB which coils around itself in a spiral pattern. The spiral pattern may take many forms including a hexagon spiral pattern. The PCB may include one or more PCB coils arranged adjacent to each other, and in some examples, the PCB may have a plurality of layers where each layer may have one or more PCB coils arranged thereon. In examples, a multi-strand wire coil is formed by coiling a multistrand wire comprising strands of the multistrand wire. The strands may be individually insulated and aggregated to form a conductor, and in some examples, one or more strands may be twisted or woven together in a prescribed pattern so that each strand in the multi-strand wire may be equally positioned at a periphery of over the length of the conductor, distributing current equally among the strands. In examples, the multi-strand wire coil may be referred to as the litz coil 106(b). In examples, the multistrand wire that forms the litz coil 106(b) is shaped as a circular coil or a rectangular coil. The transmitter pad 102 may include one or more litz coils that at least partially overlap with each other. Because of the use of the multistrand wire, the litz coil 106(b) has a reduced impedance compared to the PCB coil 106(a) resulting in improved charging efficiency, but voids associated with a plurality of litz coils may be larger compared to voids associated with a plurality of PCB coils. A void may an area where wireless power transfer is inefficient, e.g., where there are no or few PCB traces in the case of PCB coils or no or few multistrand wires in the case of litz coils. Further, a litz coil 106(*b*) may span a larger area than a PCB coil 106(*a*). The litz coil 106(*b*) may be used to charge larger devices such as handheld wireless phones because in some examples they have a receiver coil 144 which spans an area at least as large than the void of a litz coil 106(*b*). Further, use of the litz coil to charge larger devices reduces an amount of heat generated compared to using PCB coils to charge the larger devices. The PCB coil 106(*a*) may be used to charge smaller devices such as wearable devices because in some examples the smaller devices have a receiver coil 144 which spans an area larger than the void of a PCB coil 106(*a*) but spans an area smaller than a void associated with a litz coil 106(*b*).

In examples, the transmitter pad 102 may further include a controller 108 and a power circuit 110. The controller 108 and the power circuit 110 may facilitate powering the coils 106 of the transmitter pad 102. The controller 108 may be implemented using circuitry such as analog circuitry, mix signal circuitry, memory circuitry, logic circuitry, processing circuitry that executes code stored in a memory that when executed by the processing circuitry perform the disclosed functions of the controller 108, or combinations thereof. The power circuit 110 may be implemented using circuitry such as analog circuitry, mix signal circuitry, memory circuitry, logic circuitry, processing circuitry that executes code stored in a memory that when executed by the processing circuitry perform the disclosed functions of the power circuit 110, or combinations thereof.

In examples, the controller 108 may have a plurality of interfaces 112, 114, 116, 146. Interface 112 may be a voltage output such as a Universal Serial Bus (USB) output. In examples, the interface 112 may be coupled to the power circuit 110 to provide a DC voltage to the power circuit 110 and the power circuit 110 may have a DC/DC converter 118 such as a buck-boost converter which is coupled to a bridge circuit 120. An input 124 of the DC/DC converter 118 may receive the DC voltage from the interface 112 and the DC/DC converter 118 may adjust the DC voltage and provide an adjusted DC voltage at an output 126 of the DC/DC converter 118. In examples, the adjusted DC voltage may be an amplification or attenuation of the DC voltage output by the interface 112. The output 126 may be coupled to the bridge circuit 120 to provide as an input the adjusted DC voltage to the bridge circuit 120. The bridge circuit 120 may convert the adjusted DC voltage to a time varying voltage signal such as a sequence of impulse signals. In examples, the bridge circuit 120 may be a half bridge or full bridge circuit to generate the time varying voltage signal. The bridge circuit may have a plurality of transistors (not shown) which are periodically or intermittently switched on and off to generate the time varying voltage signal. The interface 114 of the controller 108 may be a pulse width modulation (PWM) output which generates a PWM wave. The PWM wave may transition periodically or intermittently from a high state to a low state and vice-versa and the interface 114 may be coupled to the bridge circuit 120 to control switching of the transistors of the bridge circuit 120 and the time varying voltage signal output by the bridge circuit 120.

In examples, the bridge circuit 120 may have two outputs 128, 130 for outputting the time varying voltage signal. Each of the coils 106 has two terminals, shown respectively in the terminal group 136 and terminal group 138. Output 128 may be selectively coupled to a terminal in terminal group 136 and output 130 may be coupled to terminals in the terminal group 138. Further, a switch 132 may be positioned between the output 128 of the bridge circuit 120 and the terminal in terminal group 136. The controller 108 may have an interface 146 which outputs a switch control signal for controlling opening and closing of the switches 132. In examples, one of the switches 132 may be closed and a remainder of the switches 132 may be open at any given time resulting in the time varying voltage signal being applied to the coil which is coupled to the closed switch. For example, closing switch 132(*a*) may result in the time varying voltage signal applied to the terminal in terminal group 136 associated with coil 106(*a*) and closing switch 132(*b*) may result in the time varying voltage signal applied to the terminal in terminal group 136 associated with coil 106(*b*). The coil 106 which receives the time varying voltage signal has an inductance and its terminal in terminal group 138 may be coupled to a capacitor 134 with a capacitance. The inductance of the coil and capacitance of the capacitor 134 may be designed so that the coil 106 which receives the time varying voltage signal resonates at a resonance frequency. In examples, the resonance frequency may be 100 KHz. The coil 106 which receives the time varying voltage signal produces a time varying magnetic field which couples to the coil 144 of the electronic device 104 and induces a voltage on the coil 144 of the electronic device 104 to wirelessly transfer power from the transmitter pad 102 to the electronic device 104.

In examples, the interface 116 of the controller 108 may be a feedback input which receives a feedback signal. The feedback input may be coupled to a terminal 140 of the capacitor 134 and receive a feedback signal from the terminal 140 of the capacitor 134. An amplitude of the feedback signal may vary depending on whether an electronic device 104 is located in proximity to a coil 106 which receives the time varying voltage signal. For example, the feedback signal may have a first amplitude if the electronic device 104 is located in proximity to a coil 106 which receives the time varying voltage signal because the coil 106 which receives the time varying voltage signal also induces a voltage in the coil 144. The coil 106 which receives the time varying voltage signal and also induces a voltage in the coil 144 is referred to as a proximate coil. As another example, the feedback signal may have a second amplitude if an electronic device 104 is not located in proximity to a coil 106 which receives the time varying voltage signal and does not induces a voltage in the coil 144. The coil 106 which receives the time varying voltage signal and does not induce a voltage in the coil 144 is not a proximate coil to the electronic device 104. The first amplitude may be lower than the second amplitude in examples. In examples, the feedback input may receive the feedback signal and the controller 108 may be arranged to measure its amplitude to determine whether a coil is proximate to the electronic device 104. The controller 108 may then select from one or more proximate coil, a coil to wirelessly transfer power to the electronic device 104 as described in further detail below.

In some examples, a foreign object such as a metallic object which is not an electronic device may cause the feedback input to have an amplitude indicative of a coil being proximate to the foreign object. The coil with the amplitude indicative of being proximate to the foreign object may be a proximate coil, but controller 108 should not transfer wireless power to the foreign object because the foreign object is not an electronic device 104. To distinguish between presence of an electronic device 104 and the foreign object, the controller 108 may use the proximate coil to confirm whether an electronic device 104 or foreign object is proximate to the proximate coil. For example, the controller 108 may cause the proximate coil of the transmitter pad 102 to send a query signal. The query signal may be generated by the controller 108 by applying a predefined PWM wave at the interface 114 of the controller 108 which causes the bridge circuit 120 to output a time varying signal indicative of the query. The electronic device 104 may be arranged to respond to the query. The query may cause the electronic device 104 to indicate whether it is a large electronic device such as a handheld wireless phone or a small electronic device such as a wearable device. Additionally, or alternatively, the query may cause the electronic device 104 to indicate a strength of a voltage at the receiver coil 144 (i.e., signal strength). The electronic device 104 may respond to the query signal by applying a current to its coil 144 which induces a voltage on the proximate coil (acting in this case as a receiver) to indicate the type of the electronic device 104 or the signal strength. The response may be received at the feedback input of the controller 108 via the terminal 140. If the response is received via the proximate coil, then the controller 108 may confirm the electronic device 104 is associated with the proximate coil based on the response at the feedback input and wirelessly transfer power to the electronic device 104 using the proximate coil. A foreign object may not send a response. If the response is not received, then the controller 108 may confirm that a foreign object is associated with the proximate coil and power should not be wirelessly transferred to the foreign object because it is not an electronic device 104.

The arrangement of the transmitter pad 102 is exemplary in nature. The transmitter pad 102 shows two coils of different types. In this example, at least one coil is a litz coil and at least one coil is PCB coil each coupled to a respective switch. In other examples, the transmitter pad 102 may have more types of coils, more number of coils, or combinations thereof. Further, in other examples, the transmitter pad 102 may have a plurality of bridge circuits coupled to the controller 104 where each bridge circuit is coupled to one or more litz coils or one or more PCB coils. Each of the bridge circuits may be powered by the DC/DC converter 118 and based on the PWM wave output by the interface 114 output an time varying voltage signal to the one of the PCB coils or the litz coils rather than the bridge circuit 120 which drives both the litz coil 106(b) and the PCB coil 106(a). In some examples, the capacitor 134 may be a plurality of capacitors in parallel (not shown). Further, in some examples, capacitance of one or more of the plurality of capacitors may differ and selected depending on which coil is coupled to the output 128. One terminal of a capacitor with a first capacitance may be coupled to a terminal in terminal group 138 associated with the PCB coil 106(a) and another terminal of the capacitor may be coupled to the output terminal 130 when the PCB coil 106(a) is coupled to the output 128 of the bridge circuit 120 via the switch 132. Otherwise, one or both of these capacitor terminals may not be so coupled. One terminal of a capacitor with a second capacitance may be coupled to a terminal in terminal group 138 associated with the litz coil 106(b) and another terminal of the capacitor may be coupled to the output terminal 130 when the litz coil 106(b) is coupled to the output 128 of the bridge circuit 120 via the switch 132. Otherwise, one or both of these capacitor terminals may not be so coupled. The transmitter pad 102 may be arranged with one or more additional switches to facilitate the described coupling of the capacitor with first capacitance and the capacitor with second capacitance.

Figure 2:
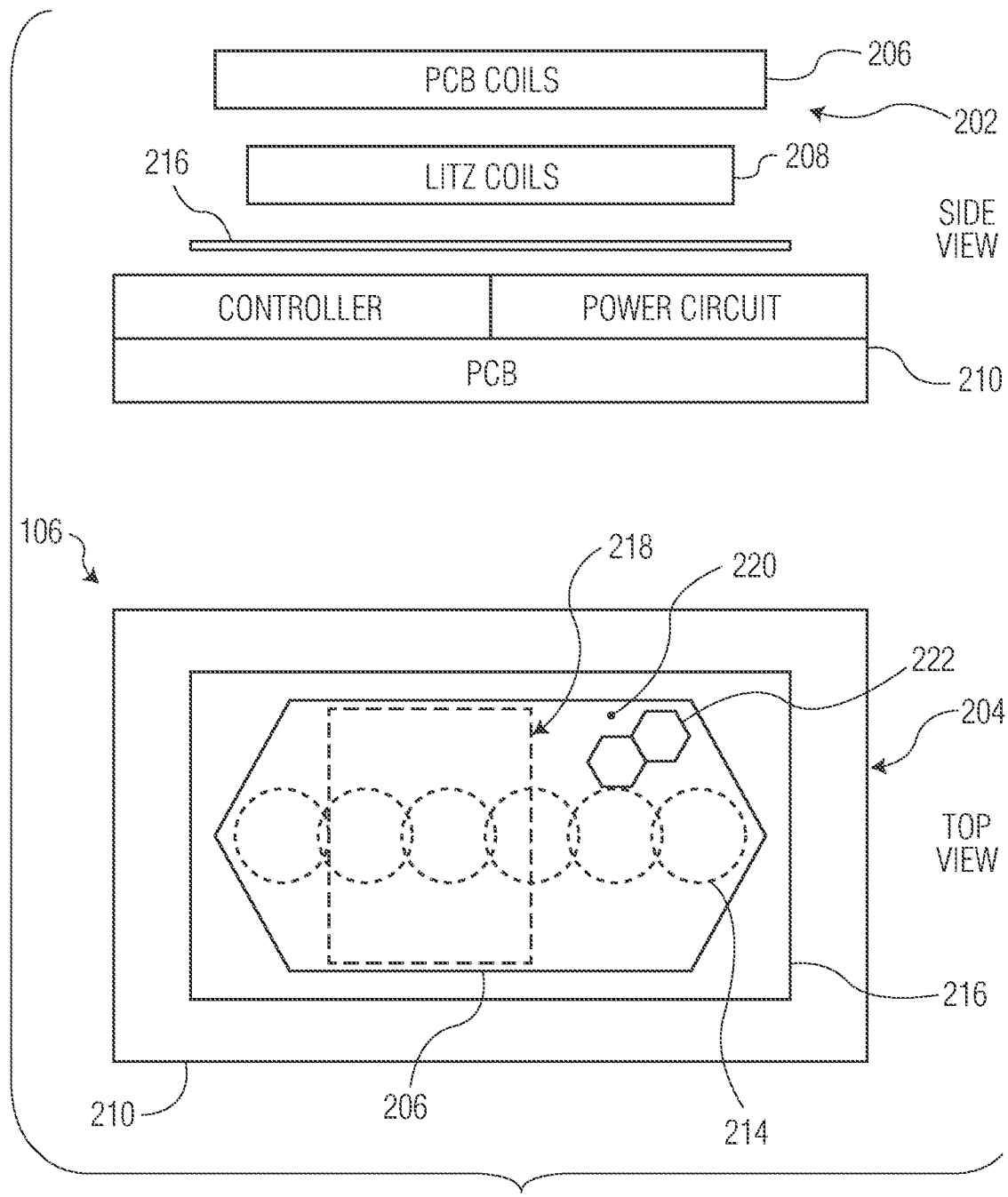
FIG. 2 illustrates an example side view and an example top view of a transmitter pad of the wireless power transfer system, where the transmitter pad has PCB coils and litz coils.

FIG. 2 illustrates an example side view 202 and a top view 204 of the transmitter pad 102 in more detail. The side view 202 shows the transmitter pad 102 arranged as a plurality of layers 206-210. A first layer 206 may have one or more PCB coils arranged on a PCB. A second layer 208 below the first layer 206 may have one or more litz coils. A third layer 210 may have a PCB which in some examples comprises the power circuit 110, the controller 108, or combinations thereof and be different from the PCB in the first layer 206. In some examples, a ferrite 216 may be positioned below one or more of the first layer 206, the second layer 208, or the third layer 210 to increase a magnetic field produced by the coils and improve induction of voltage to the receiver coil 144 of the electronic device 104 and resulting wireless power transfer from the transmitter pad 102 to the electronic device 104. In examples, the first layer 206 may be a topmost layer on the transmitter pad 102 and the third layer 210 may be bottommost layer on the transmitter pad 102. Other variations are also possible such as ordering the layers 206, 208, 210 differently.

The top view 204 illustrates the coils in more detail. One or more PCB coils in the first layer 206 may be located in an area 220 of the transmitter pad 102 referred to in some examples as a charging area. Two adjacent PCB coils 222 are shown, but in principle, a plurality of PCB coils may be positioned within the area 220. Portions of the area 220 may be referred to subareas, an example of which is shown as 218 as a dotted line region. Each of the litz coils 214 below the one or more PCB coils in the second layer 208 may be arranged as concentric rings formed within the area 220. The litz coils 214 are illustrated with dotted lines to indicate that the litz coils 214 are below the PCB coils 222. The ferrite layer 216 is shown as below the litz coils 214 in this example.

Figure 3:
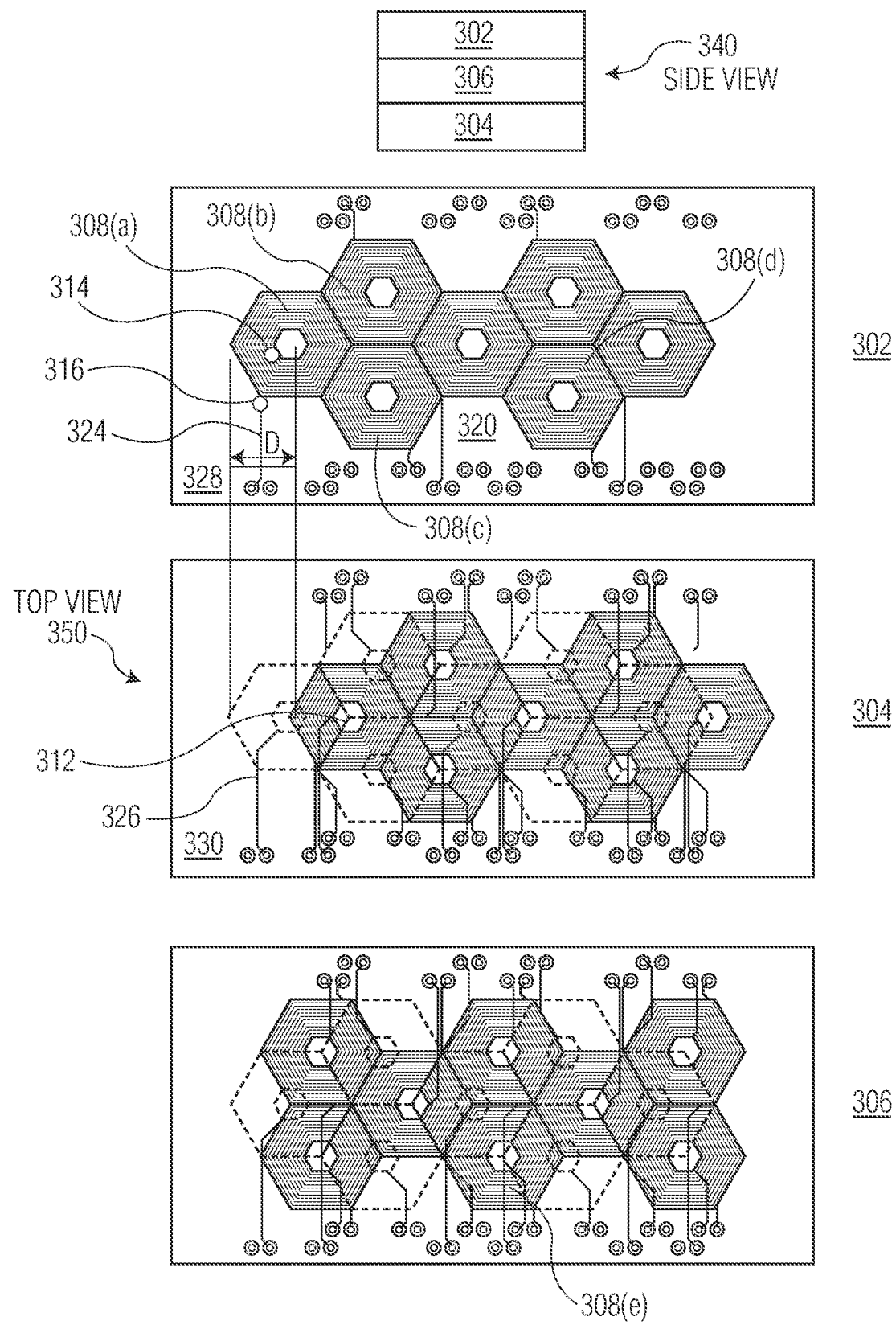
FIG. 3 illustrates the PCB coils of the transmitter pad arranged as a plurality of example sublayers.

FIG. 3 illustrates that the PCB coils are further arranged as a plurality of example sublayers 302-306 associated with the first layer 206 in a side view 340 and in a top view 350 of each of the sublayers 302-306. In the side view 340, the plurality of sublayers 302-306 may include a top sublayer 302, a bottom sublayer 304, and a middle sublayer 306 in an example. The sublayer 302-306 may be positioned on top of each other to form the layer 206 with PCB coils which span the area 220. In the top view 350, the top sublayer 302, bottom sublayer 304, and middle sublayer 306 may each have one or more PCB coils in the form of a hexagonal shape and arranged adjacent to each other, examples of which are identified as 308(a)-(e). The hexagonal shape is chosen to reduce voids between adjacent PCB coils, but the PCB coils may take other shapes as well.

Placement of the electronic device 104 in the area 220 results in the transmitter pad 102 being able to wirelessly transfer power to the electronic device 104. To form the area 220, the PCB coils in the sublayers 302-306 may be arranged so that the PCB coils in the top sublayer 302 and the bottom sublayer 304 may be arranged similarly but spatially shifted by a distance D with respect to each other. The spatial shifting results in one or more PCB coils in one sublayer being positioned under or above a void of a PCB coil in another sublayer so that the transmitter pad 102 may be able to wirelessly transmit power when the electronic device 104 is positioned over a void of a sublayer. In examples, the void may be an area of a PCB coil with no or few traces. To illustrate, the PCB coils 308(a), 308(b), 308(c) may be positioned above the void 312 so that one of

308(*a*), 308(*b*), 308(*c*) may be used to wirelessly transfer power to the electronic device 104 when the electronic device 104 is located over the void 312. Similar to the top sublayer 302 and the bottom sublayer 304, the middle sublayer 306 may have also PCB coils positioned over voids defined by one or both of the top sublayer 302 or the bottom sublayer 304. For example, PCB coil 308(*e*) may be positioned in a void 320 between PCB coils 308(*c*), 308(*d*) in the top sublayer 302 so that the transmitter pad 104 may wirelessly transfer power to the electronic device 104 when positioned over the void 320.

The three sublayers 302-306 may collectively define 22 PCB coils in this example. Further, each connections 314, 316 located at a center of a PCB coil and a periphery of the PCB coil respectively may be coupled to respective terminals 136, 138. To illustrate as an example, the connection 316 at the periphery of a PCB coil 308(*a*) may be coupled to a PCB trace 324 in the top layer 302 which connects to one of the terminals in the group of terminals 136, 138 though via 328 of the top layer 302. To further illustrate as an example, the connection 314 at a center of the PCB coil 308(*a*) may be coupled through a via in the top layer 302 also at the center of the PCB coil 308(*a*) to a PCB trace 326 in the bottom layer 304 which connects to one of the terminals in the group of terminals 136, 138 though via 330 of the bottom layer 304. Other mechanisms for connections are also possible.

Each PCB coil may be wound in a same direction and have a similar inductance. A sum of a length of a trace which connects the PCB coil to its terminals and a length of the trace of the spiral that makes up the PCB coil may determine inductance of the PCB coil. To maintain a similar inductance across PCB coils, the PCB coils on the top sublayer 302 may have different number of turns compared to PCB coils in the bottom sublayer 304 to maintain a substantially similar inductance of PCB coils in the different sublayers. In examples, the PCB coils in the top layer 302 may have more turns than the PCB coils in the bottom layer 304 to maintain a substantially similar inductance of PCB coils in the different sublayers. In other examples, one or more PCB coils may have a different inductance. Further, each of the litz coils may have the same or different number of turns and similar or different inductance. In one example, the litz coils may alternate between a lower and higher inductance between adjacent litz coils. One litz coil may have an inductance of 9.8 microHenries and the adjacent litz coil may have an inductance of 10.2 microHenries. Other variations are also possible.

Figure 4:
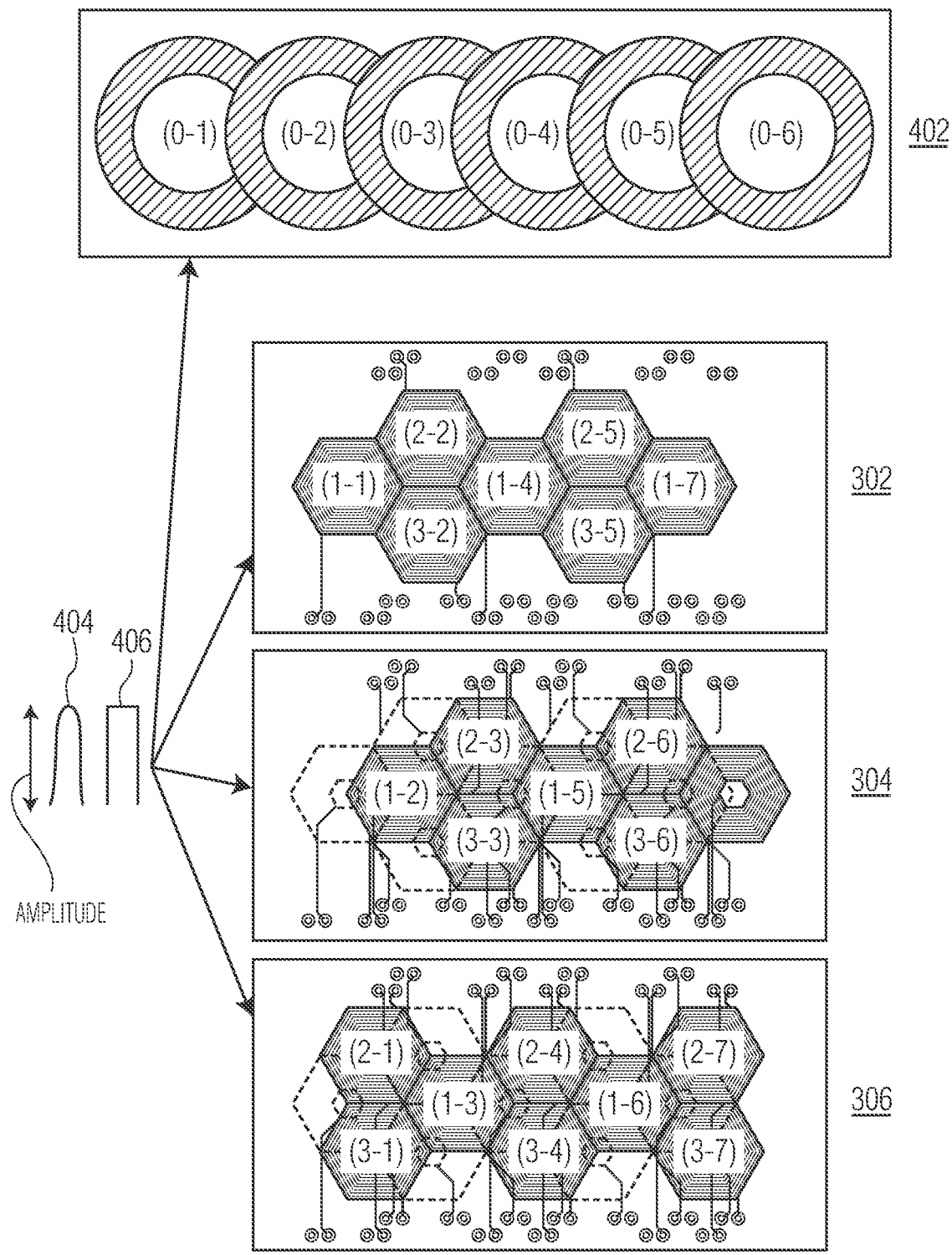
FIG. 4 illustrates an example process for applying a detection signal to detect a PCB coil or a litz coil for wirelessly transferring power to the electronic device.

FIG. 4 illustrates an example process for applying a detection signal to detect whether the electronic device 104 as described above is proximate to a PCB coil or litz coil. The detection may involve applying the time varying signal output by the bridge circuit 120, also referred to as the detection signal, to each of one or more of the coils 106. In examples, the detection signal which is applied to the one or more coils 106 may be controlled by the switch 132. One of the switches 132 may be closed to allow the detection signal to be applied to a coil 106 and the remaining switches 132 may be open.

The detection signal may take many forms such as an impulse signal generated by the bridge circuit 120. The impulse signal may be a sinusoidal signal shown as wave 404 or a square wave shown as wave 406. The detection signal may have an amplitude. In examples, the detection signal may be applied to one or more PCB coils in each of the layers 302 to 306 and to one or more litz coils in the top view 402 of the litz coils in a predefined order.

Each of the litz coils may be uniquely identified by a label such as N-M where N indicates a signaling sequence and M indicates a number of a coil in the signaling sequence. For example, the litz coils in the top view 402 may be assigned signaling sequence N=0 and each litz coil assigned a unique value M so that the litz coils are labeled from (0-1) to (0-M). In examples, the detection signal may be applied to each litz coil starting with a lowest coil number M to a highest coil number M in order such that the detection signal is applied to each of litz coil (0-1), (0-2), (0-3) . . . (0,6) as shown in the top view 402, for example.

The transmitter pad 102 may also have the plurality of layers of PCB coils 302-306. As described above, the sublayer 302 may be a top layer, the sublayer 304 may be a bottom layer, and the sublayer 306 may be a middle layer of the PCB coil layer 206. The detection signal may be applied to one or more PCB coils. For example, PCB coils in each of the sublayers 302-306 may be labeled by N=1, 2, 3 and M=1-7. Each N may identify a sequence for applying the detection signal to PCB coils in the different layers and M may identify the PCB coils in the sequence. For example, the detection signal may be applied to each of PCB coils (1-1), (1-2) . . . (1-7) in each of the sublayer 302, the sublayer 304, the sublayer 306, the sublayer 302, the sublayer 304, the sublayer 306, and the sublayer 302 in a center area of the transmitter pad 102 from left to right to form a sequence N=1. As another example, the detection signal may be then applied to each of PCB coils (2-1), (2-2) . . . (2-7) in the sublayer 306, the sublayer 302, the sublayer 304, the sublayer 306, the sublayer 302, the sublayer 304, and then the sublayer 306 respectively at an upper area of the transmitter pad 102 from left to right to form a sequence N=2. In yet another example, the detection signal may be then applied to each of PCB coils (3-1), (3-2) . . . (3-7) in the sublayer 306, the sublayer 302, the sublayer 304, the sublayer 306, the sublayer 302, the sublayer 304, and then the sublayer 306, respectively at a lower area of the transmitter pad 102 from left to right to form a sequence N=3. The detection signal may be applied to the PCB coils in other ways as well. For instance, other signaling sequences may be defined to provide the detection signal to coils in a left area, middle area, or right area of the transmitter pad 102.

For each detection signal applied to each coil, a feedback signal at a terminal 140 of the capacitor 124 may be input to the interface 116 of the controller 108 associated with a feedback input and the controller 108 may be arranged to measure an amplitude of the feedback signal. For example, interface 116 may have an analog-to-digital converter and thresholding circuit to make this determination. If the amplitude is equal to a threshold amplitude, then the electronic device 104 may not be located proximate to a coil. If the amplitude less than the threshold amplitude, then the electronic device 104 may be located proximate to a coil. In some examples, the amplitude may need to be less than the threshold amplitude by a given amount to account for resistive losses, impedance losses, or combinations thereof in a coil.

Figure 5:
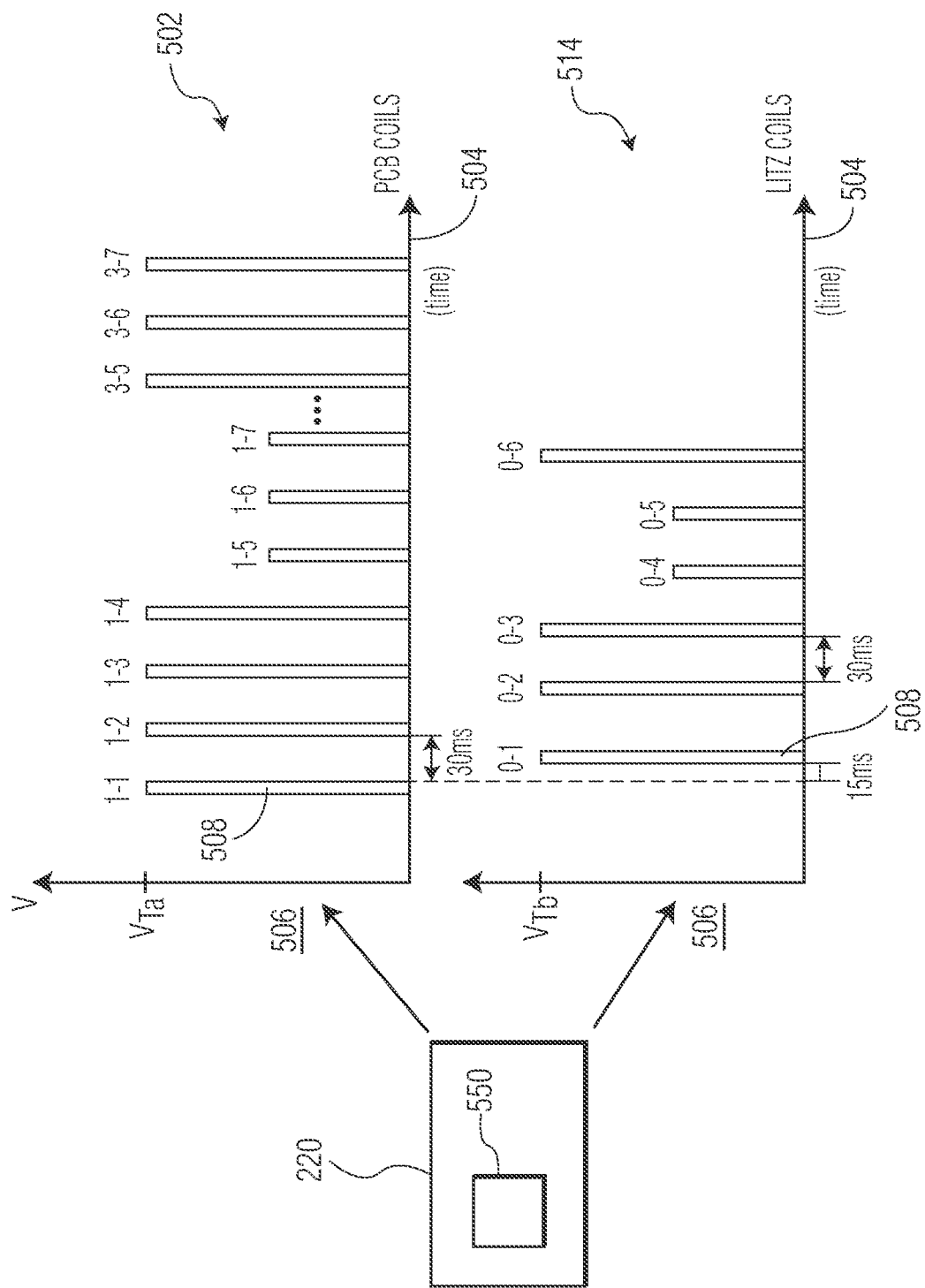
FIG. 5 illustrates example plots of a feedback signal received at a controller of the transmitter pad as a function of time as a result of applying a detection signal to a plurality of PCB coils and litz coils when an object is located in an area of the transmitter pad.

FIG. 5 illustrates example plots as a result of applying a detection signal to each of a plurality of PCB coils and litz coils when the electronic device 104 or a foreign object is located in the area 220 of the transmitter pad 102. The detection signal which is applied to each coil may facilitate determining the coil which is proximate to the electronic device 104 or the foreign object.

Example plot 502 shows the feedback signals as a result of applying the detection signal to each of a plurality of PCB coils. The detection signal may be applied to the PCB coils in accordance with the signaling sequence N=1, 2, and 3 in the following order: 1-1, 1-2, 1-3 . . . 1-7, 2-1, 2-2 . . . 2-7, 3-1, 3-2 . . . 3-7 described with respect to FIG. 4. The plot 502 shows an amplitude of the feedback signals along axis 506 measured by the feedback input at the interface 116 of the controller 108 as a function of time along axis 504. The plot 502 is generated as a result of applying the detection signal to each of the PCB coils labeled 1-1 to 3-7 with respect to FIG. 4 in the area 220 where an object 550 may be positioned. The detection signal may take the form of an impulse signal, for example, and the controller 108 may receive the feedback signals, an example of which is shown as feedback signal 508 associated with coil 1-1. The feedback input may receive a feedback signal with an amplitude equal to the threshold voltage $V_{ta}$ in the example if an object 550 is not detected proximate to a PCB coil and an amplitude less than the threshold voltage $V_{ta}$ if the object 550 is detected proximate to a PCB coil. The plot 502 shows results of applying the detection signal to each of the PCB coils starting with coil 1-1 and ending with coil 3-7, a detection signal applied to each coil every 30 ms, and a respective feedback signal resulting from each detection signal. A label above each feedback signal indicates the coil associated with the feedback signal. Certain coils are identified which resulted in an feedback signal with an amplitude less than $V_{ta}$, such as proximate coils 1-5, 1-6, and 1-7 whose feedback signal have the same amplitude. These proximate coils 1-5, 1-6, and 1-7 may be proximate to the object 550.

In one example, the first coil which resulted in a feedback signal with an amplitude less than $V_{ta}$ may be selected based on the proximate coils and a response to a query signal. The object 550 may be an electronic device 104 or a foreign object. The controller 108 may check to see whether the object 550 is an electronic device 104 by causing a query signal of device type such as time varying signal to be applied to the first coil. If the object 550 is in the form of the electronic device 104, then the controller 108 may receive a response to the query signal which indicates that the object 550 is the electronic device 104. The first proximate coil is selected of the proximate coils which is coil 1-5 in the example. If the object 550 is not the electronic device 104, then the controller 108 receives no response, determines that the object not an electronic device 104, and no proximate coil is selected from the proximate coils.

In another example, one of the proximate coils which resulted in an feedback signal with an amplitude less than $V_{ta}$ and not necessarily the first coil which resulted in an feedback signal with an amplitude less than $V_{ta}$ may be selected based on the proximate coils and a response to a query signal for signal strength. The controller 108 may further cause a time varying signal in the form of the query signal to be applied to each of the coils that resulted in an feedback signal with an amplitude less than $V_{ta}$. Based on the query signal, the controller 108 may then receive a respective signal strength response as a feedback signal. The respective signal strength may indicate a measure of power of the query signal at the electronic device 104, for example. The proximate coil associated with a highest signal strength or signal strength which exceeds a strength threshold may be selected from the proximate coils such as one of proximate coils 1-5, 1-6, or 1-7. If the object 550 is not the electronic device 104, then the controller 108 receives no response, determines that the object 550 not an electronic device 104, and no proximate coil is selected from the proximate coils.

The detection signal may be also applied to each litz coil in accordance with the signaling sequence N=0 in the following order 0-1 to 0-6 described with respect to FIG. 4. Plot 514 shows the feedback signals as a result of applying the detection signal such as 410 or 412 to each of the litz coils labeled 0-1 to 0-6 with respect to FIG. 4. The detection signal may take the form of an impulse signal, for example, and the controller 108 may receive the feedback signals, an example of which is shown as feedback signal 512 associated with coil 0-1. The plot 514 shows the amplitude of the feedback signal measured by the controller 108 along axis 506 as a function of time along axis 504. The feedback input of the controller 108 may receive the feedback signal with an amplitude equal to the threshold voltage $V_{tb}$ or an amplitude less than the threshold voltage $V_{tb}$. The plot 514 shows feedback signals resulting from applying the detection signal to each of the litz coils in accordance with signaling sequence M=0 starting with coil 0-1 and ending with coil 0-6 as shown in FIG. 4, and another coil may be signaled every 30 ms. The plot 514 shows that certain coils have a feedback signal with an amplitude less than the threshold voltage $V_{tb}$, such as coils 0-4 and 0-5 as proximate coils to the object 550. Similar to the analysis with respect to the PCB coils, litz coil 0-4 may be selected from the proximate litz coils or one of litz coil 0-4 or 0-5 associated with a highest signal strength or signal strength which exceeds a strength threshold may be selected. If the object 550 is not the electronic device 104, no proximate litz coil is selected from the proximate litz coils. In examples, threshold $V_{tb}$ associated with the litz coils may be different from threshold $V_{ta}$ associated with the PCB coils.

In some examples and as shown in FIG. 5, the controller 108 may be arranged to interleave sending the detection signal to PCB coils and litz coils. A detection signal may be sent to each of the PCB coils at 30 ms intervals, a detection signal may be sent to each of the litz coils at 30 ms intervals, where the detection signal to a litz coil and the detection signal to a PCB coil are offset by 15 ms which results in the feedback signals from each coil shown in plots 502, 514 also being interleaved by 15 ms.

Figure 6:
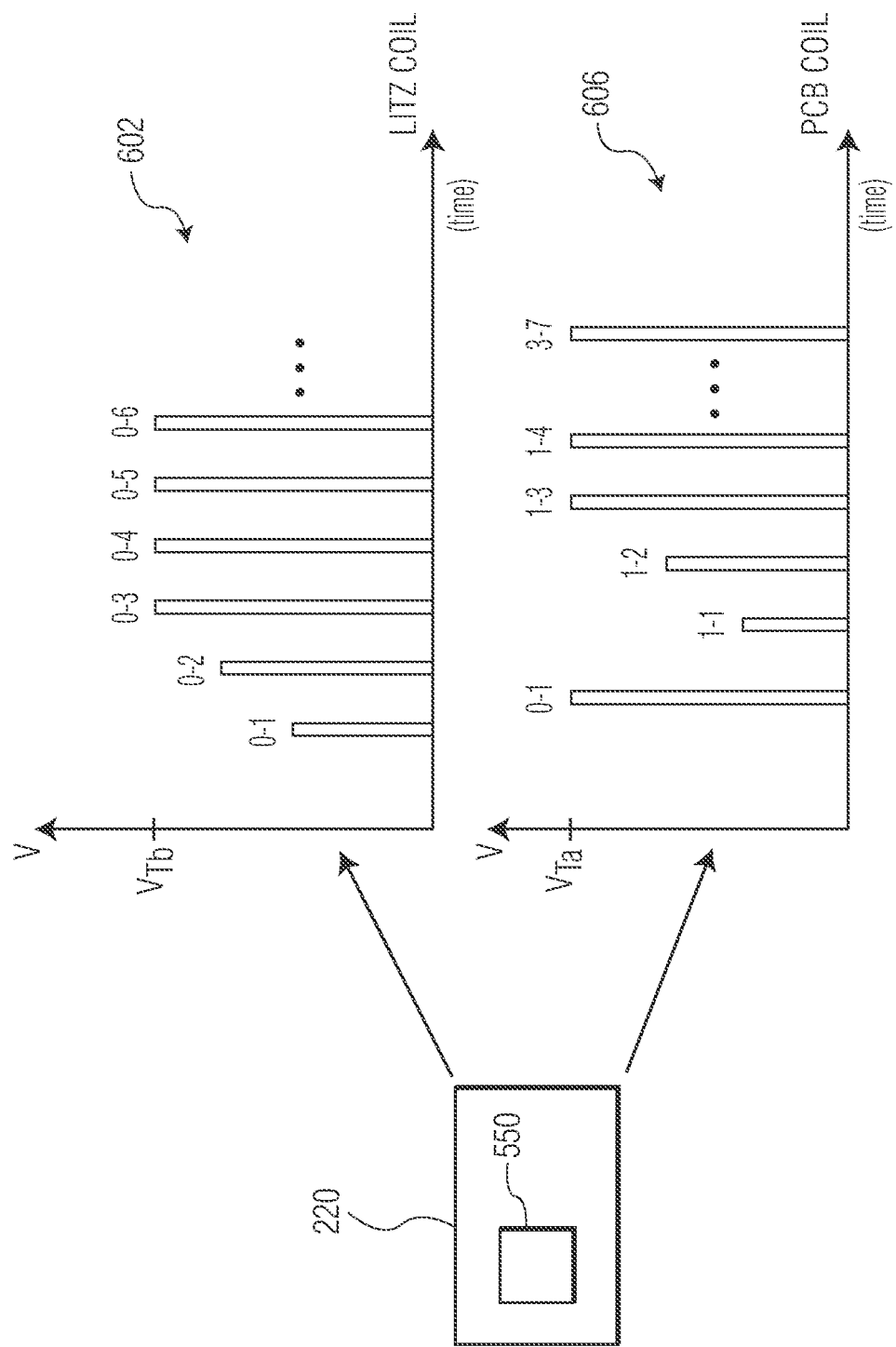
FIG. 6 also illustrates example plots of a feedback signal received at a controller of the transmitter pad as a function of time as a result of applying a detection signal to a plurality of PCB coils and litz coils when an object is located in the area of the transmitter pad.

FIG. 6 also illustrates example plots as a result of applying a detection signal to a plurality of PCB coils and litz coils when the object 550 is located in the area 220 of the transmitter pad 220. For example, example plot 602 shows the feedback signals as a result of applying a detection signal to each of the litz coils labeled 0-1 to 0-6 with respect to FIG. 4 in the area 220. As another example, example plot 606 show the feedback signals as a result of applying a detection signal to PCB coils in the area 220 when an electronic device 104 is located proximate to the PCB coils. The plot 602 indicates litz coil 0-1 and litz coil 0-2 have a feedback signal less than the threshold voltage $V_{tb}$ in the example. Further, the feedback signal associated with litz coil 0-1 has a lowest amplitude of the litz coils associated with feedback signals having amplitudes less the threshold voltage $V_{tb}$. As a result, the controller 108 may select the litz coil 0-1 from the proximate coils. The plot 606 indicates PCB coil 1-1 and 1-2 have a feedback signal less than the threshold voltage $V_{ta}$ in the example. Further, the feedback signal associated with PCB coil 1-1 has a lowest amplitude of the PCB coils associated with feedback signals having amplitudes less the threshold voltage $V_{ta}$. As a result, the controller 108 may select the PCB coil 1-1 from the proximate coils. In other examples, the controller 108 may determine the coil which has a feedback signal less than the threshold voltage and a highest signal strength or signal strength which exceeds a strength threshold as the selected proximate coil to the object 550, rather than the coil associated only with the lowest feedback signal.

In examples, one of the selected proximate coil of proximate litz coils and the selected proximate coil of proximate PCB coils may be further selected to wirelessly transfer power to the electronic device 104. The coil which is selected to wirelessly transfer the power to the electronic device 108 may depend on a type of the electronic device 108. In examples, the selected litz coil of the proximate litz coils may wirelessly transfer power to the large electronic device when the selected litz coil is located proximate to the electronic device 104 in the form of a large electronic device (one type) such as handheld wireless phone and the selected PCB coil of the proximate PCB coils may wirelessly transfer power to the small electronic device (another type) when the selected PCB coil is located proximate to the electronic device in the form of a small electronic device such as a wearable device. The large electronic device may not be charged with a PCB coil because the litz coil has a lower impedance compared to the PCB coil which results in a wireless power transfer at a faster rate compared to the charging by the PCB coil.

The controller 108 may determine whether the electronic device 104 is a large device such as a handheld wireless phone or the electronic device is a small electronic device such as a wearable device. This determination may be made by the communication between the selected proximate litz coil or the selected proximate PCB coil and the electronic device 104 such as the query signal of device type described above. The response to the query signal from the electronic device 104 may indicate whether the electronic device 104 is a large electronic device such as a handheld wireless phone or a small electronic device such as a wearable device. The controller 108 may determine whether to wirelessly transfer power via the selected proximate litz coil or the selected proximate PCB coil based on the type of the electronic device 104 as described above.

Example Operation

Figure 7:
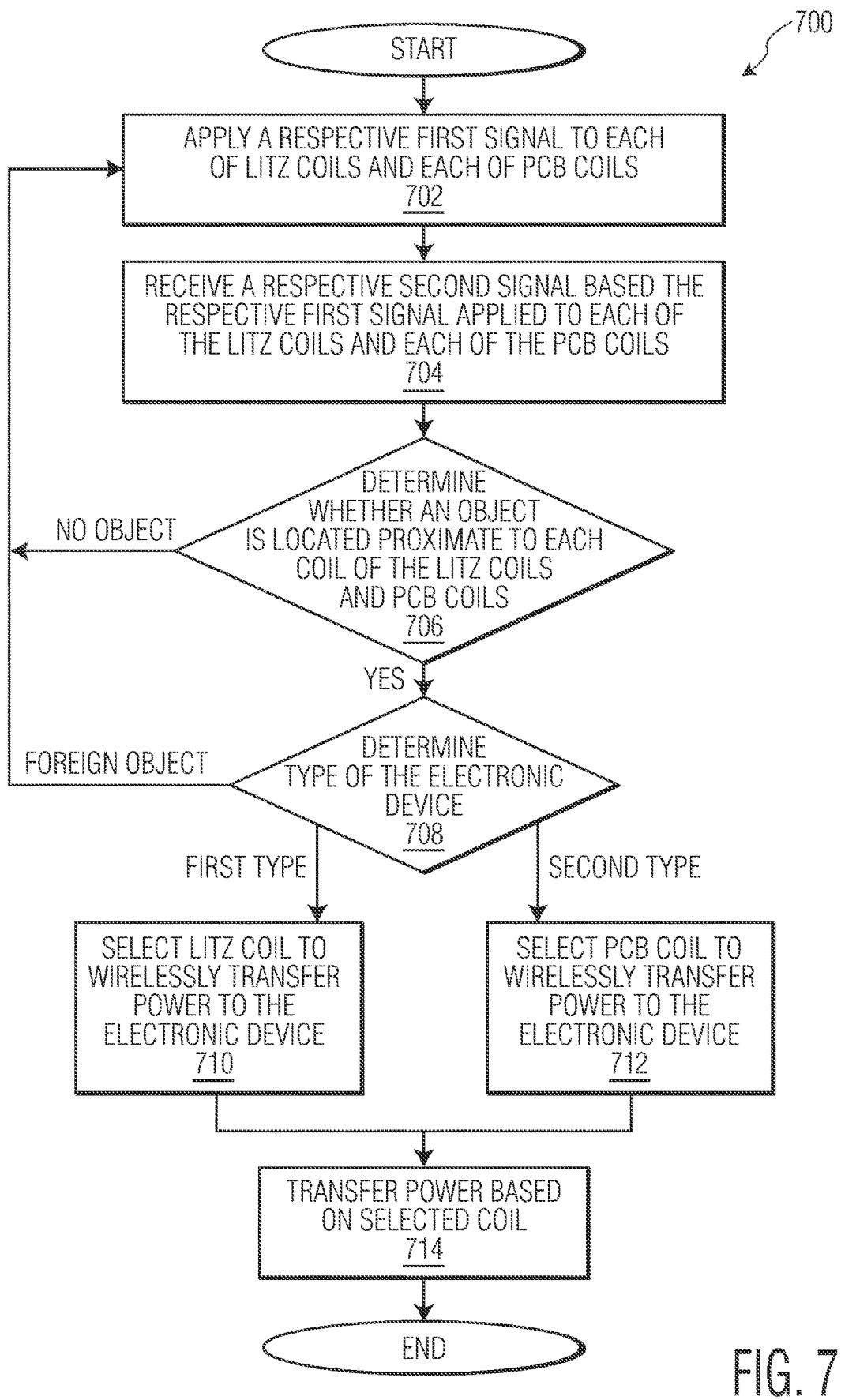
FIG. 7 is an example flow chart of functions associated with wirelessly powering the electronic device such a handheld wireless phone or wearable device.

FIG. 7 is an example flow chart of functions 700 associated with wirelessly powering an electronic device such a handheld wireless phone device or wearable device. In examples, a function of the functions 700 may be implemented using circuitry such as analog circuitry, mix signal circuitry, memory circuitry, logic circuitry, processing circuitry that executes code stored in a memory that when executed by the processing circuitry perform the disclosed functions, or combinations thereof.

At 702, a respective first signal is applied to each of the litz coils and each of the PCB coils. Each first signal may be an impulse signal generated as a result of the controller 108 outputting a PWM wave at the interface 114 which causes the bridge circuit 110 to output the impulse signal to a coil 106. In examples, the first signal may be a detection signal.

At 704, a respective second signal is received based on each respective first signal applied to each of the litz coils and each of the PCB coils. The controller 108 may receive the respective second signal at the interface 116 via a terminal 140 associated with the coils 106. In examples, a respective second signal may be a feedback signal.

At 706, a determination is made whether an object is located proximate to each coil of the litz coils and PCB coils based on the first signal applied to each of the litz coils and each of the PCB coils and the received respective second signal. The controller 108 may compare an amplitude of a respective second signal associated with a coil to a voltage threshold. If the amplitude is less than the voltage threshold, then an object may be located proximate to a coil. The amplitude may be less than the threshold because the coil 106 induces a voltage in the object. If the amplitude is not less than the threshold, then an object may not be located proximate to a coil. The amplitude is not less than the voltage threshold because the coil 106 may not induce any voltage in the object. In examples, this process is repeated for each of the coils. If no coils have an amplitude that is less than the voltage threshold, then no proximate coils are identified and processing returns to 702. If one or more coils have an amplitude less than the voltage threshold, then these coils are proximate coils to the object and processing continues to 708.

At 708, the type of the object is determined. The object may be an electronic device 104 or a foreign object such as a metallic object which is not an electronic device. The controller 108 may cause a query signal to be applied to a coil which causes an electronic device 104 to respond with its type such as a small device such as a wearable device or a large device such as a handheld wireless phone. The coil which is used to perform the query may be one which has a respective second signal with an amplitude less than the voltage threshold. If there is no response, then the object is a foreign object which is not an electronic device 104 and processing returns to 702. If there is a response which indicates the type of object is an electronic device, then processing continues to either 710 or 712. In other examples, a type of object may be determined based on a number of PCB coils indicated as being proximate to the object. If the number of PCB coils indicated as being proximate is greater than a threshold amount, then the type of object may be a large object such as a handheld wireless phone while if the number of PCB coils indicated as being proximate is not greater than the threshold amount, then the type of object may be a small object such as a wearable device. In examples, the determination of the type of object may also be based on whether the PCB coils indicated as being proximate are adjacent to each other. A number of the adjacent PCB coils greater than a threshold amount may indicate that the type of object is the large object, otherwise the object is a small object. The query may then indicate whether the object is a foreign object.

At 710, if the electronic device is a first type such as a large electronic device such as a handheld wireless phone device, then a litz coil of proximate litz coils is selected to wirelessly transfer power to the electronic device. The selected litz coil is used to efficiently transfer power to the large electronic device rather than the PCB coil which may be less efficient. The controller 108 may be arranged to make this selection. If only one litz coil has a respective feedback signal less than a voltage threshold, then that litz coil may be selected as the selected litz coil. If more than one litz coil has a respective feedback signal less than a voltage threshold and these feedback signals are different values, then the litz coil selected as the selected litz coil may be that litz coil with a lowest feedback signal. Alternatively, if more than one litz coil has a respective feedback signal less than a voltage threshold and these feedback signals are different values, then the controller 108 may further determine the litz coil which is associated with a highest signal strength or signal strength which exceeds a strength threshold and select that litz coil as the selected litz coil. If more than one litz coil has a respective feedback signal less than a voltage threshold and the feedback signals are the same values (or within a given range of each other), then the litz coil selected as the selected litz coil may be based the first litz coil which was detected to have a respective feedback signal less than the voltage threshold. Alternatively, if more than one litz coil has a respective feedback signal less than a voltage threshold and the feedback signals are the same values (or within a given range of each other), then the controller 108 may further determine as the selected litz coil the litz coil which is associated with a highest signal strength or signal strength which exceeds a strength threshold and select that litz coil.

At 712, if the electronic device is second type such as a small electronic device such as a wearable device, then a PCB coil of proximate PCB coils is selected to wirelessly transfer power to the electronic device 104. The controller 108 may be arranged to make this selection. If only one PCB coil has a feedback signal less than a voltage threshold, then that PCB coil may be selected as the selected PCB coil. If more than one PCB coil has a respective feedback signal less than a voltage threshold and the feedback signals are different values, then the PCB coil selected as the selected PCB coil may be that PCB coil with a lowest feedback signal. Alternatively, if more than one PCB coil has a respective feedback signal less than a voltage threshold and the feedback signals are different values, then the controller 108 may determine from those PCB coils, the PCB coil which is associated with a highest signal strength or signal strength which exceeds a strength threshold and select that PCB coil as the selected PCB coil. If more than one PCB coil has a respective feedback signal less than a voltage threshold and the feedback signals are the same values (or within a given range of each other), then the PCB coil selected as the selected PCB coil may be based on the first PCB coil which was detected to have a respective feedback signal less than the voltage threshold. Alternatively, if more than one PCB coil has a respective feedback signal less than a voltage threshold and the feedback signals are the same values (or within a given range of each other), then the controller 108 may determine from those PCB coils, the PCB coil which is associated with a highest signal strength or signal strength which exceeds a strength threshold and select that PCB coil as the selected PCB coil. Other variations are also possible.

At 714, the selected litz coil or the selected PCB coil may then wirelessly transfer power to the electronic device 104. The bridge circuit 120 may apply a time varying signal or power signal to cause a magnetic field which induces a voltage in the selected coil and transfer power to the electronic device 104.

In examples, steps 702-714 may performed one more times. For instance, the steps 702-714 may be performed when the transmitter pad is powered up after being powered down or to determine whether the electronic device is still on the transmitter pad 102. Further, the first signal may be applied to a subset of the litz coils or a subset of PCB coils rather than all of the litz coils and PCB coils a subsequent time steps 702-714 are performed. The subset may include those coils were previously associated with a signal strength which exceeds a threshold or previously had a respective second signal which was less than a voltage threshold. By performing steps 702-714 for the subset, a time is reduced to identify a coil to wirelessly transfer power.

In some examples, the controller 108 may apply the first signal to only each of the litz coils and receive the respective second signal from only each of the litz coils rather than both types of coils in steps 702-706. If a large electronic device is on the transmitter pad 102, then the litz coil is used to wirelessly transfer power to the large electronic device. Detection signals may not need to be provided to the PCB coils saving processing time and power in some instances.

Figure 8:
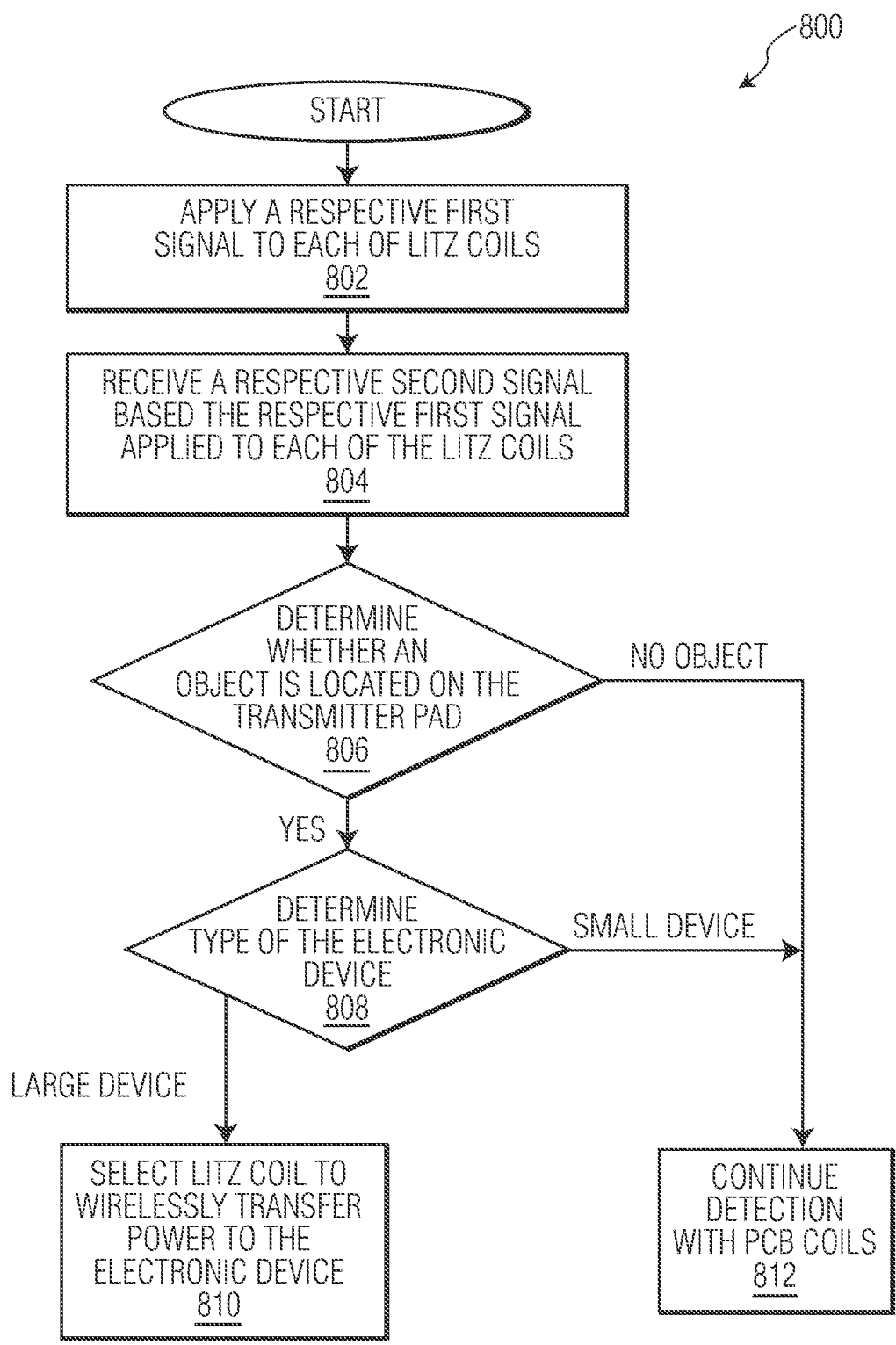
FIG. 8 is another example flow chart of functions associated with wirelessly powering the electronic device such a handheld wireless phone or wearable device.

FIG. 8 is an example flow chart of functions 800 associated with determining a litz coil to wirelessly power the large electronic device such a handheld wireless phone without having to send detection signals to the PCB coils. At 802, a respective first signal is applied to each of the litz coils. At 804, a respective second signal is received based on the respective first signal applied to each of the litz coils. At 806, a determination is made whether an object is located on the transmitter pad 102. The determination of whether there is an object may be based on feedback signals from the litz coils compared to the voltage threshold as described above. If there is no object, processing continues to detect an object with the PCB coils at 812 which performs processing in accordance with one or more of steps 702-708, 712-714 as they relate to the PCB coils. If there is an object located on the transmitter pad 102, then at 808, a type of the object is determined. If the type of object is a small device such as a wearable device, then processing continues to detect an object with the PCB coils at 812 which performs processing in accordance with one or more of steps 702-708, 712-714 as they relate to the PCB coils. If the object is a large electronic device such as a handheld wireless phone, then a litz coil is selected to wirelessly transfer power to the large electronic device at 810. In this manner, detection signals may not need to be provided to the PCB coils if the large electronic device is determined to be on the transmitter pad.

In some examples, the area 220 may be subdivided into one or more non-overlapping or overlapping subareas in the area 220. An example of a subarea is shown as subarea 218 and the functions 702-714 or 802-812 may be performed for the coils in each of the subareas. A respective first signal is applied to each of the litz coils and each of the PCB coils in the subarea 218 and a respective second signal is received based on the respective first signal applied to each of the litz coils and each of the PCB coils in the subarea 218. In examples, one of the signaling sequence N=1, N=2, or N=3 may be associated with a subarea depending on whether the subarea covers an upper area, center area, or lower area, respectively, of the transmitter pad 102. Then, one of the signaling sequence N=1, N=2, or N=3 associated with PCB coils in the subarea may be applied to identify a proximate coil which is a PCB coil. Further, a time to identify a proximate coil is lessened because the detection signal is applied to less than all PCB coils of the transmitter pad 102. In turn, wireless power is transferred to the electronic device 104 in the subarea 218 by a coil in the subarea which is proximate to the electronic device 104 in the subarea 218. In this regard, wireless power may be transferred to a respective device in a subarea and the area 220 may transfer power to multiple devices. Further, if a subarea is already charging a device, then the functions 702-714 or 802-812 may be not repeated for the coils in that subarea.

In some examples, the wireless power transfer system 100 may also be used to power a single electronic device 104 with two or more coils 106. The electronic device 104 may be located in the area 220 and the two or more coils 106 to power a single electronic device 104 may be coils determined in accordance with steps 702-704, 802-804 which have a respective feedback signal with an amplitude less than the threshold voltage. Not only is the coil associated with the feedback signal with a smallest amplitude or received earliest in time selected to wirelessly transmit power but a plurality of coils with an amplitude less than the threshold voltage may be also selected to wirelessly transmit power. The two or more coil 106 may be litz coils or PCB coils depending on a type of the electronic device 104.

In some examples, if coil of a first type such as a litz coil is chosen to transfer power to the electronic device 104 in a first subarea, the coil of a second type such as the PCB coil may be used to transfer power to another electronic device 105 in a second subarea while the litz coil transfers power to the electronic device 104 in the first subarea. The coil of the first type such as the litz coil may not be available to transfer power in the second subarea and only the coils of the second type such as the PCB coils are available. In this example, only a respective first signal may be applied to the available coils in step 702 for the second subarea and a respective second signal is received from the available coils. For instance, one of the signaling sequence N=1, N=2, or N=3 associated with PCB coils in the second subarea may be used to identify a proximate coil which is a PCB coil depending on whether the second subarea covers an upper area, center area, or lower area of the transmitter pad 102.

In examples, an amplitude of a signal such as a feedback signal may be determined to be less than a voltage threshold. The determination of whether the amplitude of the signal is less than a voltage threshold may include determining whether an absolute difference between the amplitude of the signal and the voltage threshold is greater than zero. Alternatively, the determination of whether the amplitude of the signal is less than a voltage threshold may include determining whether an absolute difference between the amplitude of the signal and the voltage threshold is greater than a difference threshold, where the difference threshold is greater than zero. Other variations are also possible for making this determination.

In examples, if a coil is identified to be proximate to a foreign object, then a first signal may not be applied to the identified coil in step 702 or 802 to reduce a time associated with identifying a coil proximate to the electronic device 104 when steps 702-714 or 802-812 are performed again for the transmitter pad 102. The first signal may not be applied to the identified coil for a period of time, after which the first signal may be applied. The period of time may be indicative of a duration after which the foreign object might have been removed from the transmitter pad 102.

Figure 9:
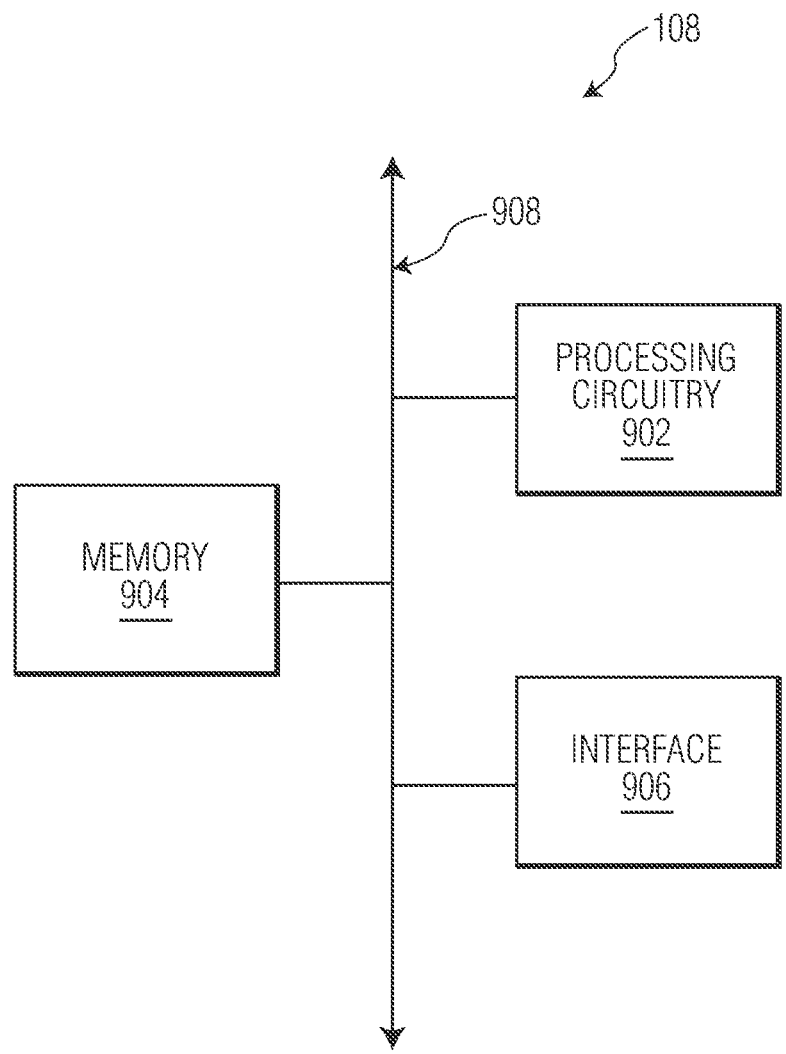
FIG. 9 is an example block diagram of the controller associated with wirelessly transferring power to the electronic device.

FIG. 9 is a block diagram of the controller 108 associated with wirelessly transferring power to the electronic device. The controller 108 may having processing circuitry 902 (possibly including multiple processors, multiple cores, multiple nodes, or combinations thereof implementing multi-threading, etc.) and memory 904 such as system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more other possible realizations of non-transitory machine-readable media/medium. The memory 904 may store computer code, program instructions, computer instructions, program code for performing one or more operations or control of operations associated the controller 108 as described above. The controller 108 also includes an interconnect 908 such as a bus (e.g., PCI, ISA, PCI-Express) which couples the processing circuitry 902 and memory 904 and one or more interfaces shown as interface 906. The interface 906 may correspond to interfaces 112-116, 146 associated with control of the coils 106. The controller 108 may include other components as well.

In examples, the disclosed transmitter pad 102 enables transferring wireless power to an electronic device positioned freely in an the area 220 of the transmitter pad 102 by detecting coils proximate to the electronic device and wirelessly transferring power based on a proximate coil. Further, the use of litz coil and PCB coils on the transmitter pad allows for efficient transfer of power depending on a type of the electronic device. Litz coils may be used to wirelessly transfer power a handheld wireless phone and a PCB coil is used to wirelessly transfer power to wearable devices because the handheld device may have a larger receiver coil than a receiver coil of the wearable device. Further, the transmitter pad 102 divided into subareas facilitates performing wireless power transfer to two or more electronic devices. The disclosed transmitter pad 102 may have additional advantages as well.

In one embodiment, a method for wirelessly transferring power to an electronic device is disclosed. The method comprises: applying a respective first signal to a first terminal of each of one or more litz coils and each of one or more printed circuit board (PCB) coils; receiving a respective second signal from a second terminal associated with each of the one or more litz coils and the one or more PCB coils based on the respective first signal applied to the first terminal of each of the one or more litz coils and each of the one or more PCB coils; selecting a coil of the one or more litz coils and the one or more PCB coils based on the received respective second signal from the second terminal associated with one or more of the one or more litz coils and the one or more PCB coils; and causing the selected coil to wirelessly transfer the power to the electronic device. In an embodiment, the method further comprising sending a query to the electronic device to request an indication of a type of the electronic device and receiving a response to the query indicating the type of the electronic device; and wherein selecting the coil of the one or more litz coils and the one or more PCB coils comprises selecting the coil based on the type of the electronic device. In an embodiment, selecting the coil comprises selecting a litz coil of the one or more litz coils as the selected coil based the type of the electronic device being a handheld wireless phone and selecting a PCB coil of the one or more PCB coils as the selected coil based the type of the electronic device being a wearable device. In an embodiment, a foreign object is further located on a transmitter pad comprising the one or more litz coils and the one or more PCB coils, the method further comprises performing a query for a type of the electronic device, not receiving a response to the query, and not causing any coil to wirelessly transfer power based on not receiving the response to the query. In an embodiment, applying the respective first signal comprises applying the respective first signal to one coil of a first set of the one or more PCB coils in a first layer of coils followed by applying the respective first signal to one coil of a second set of the one or more PCB coils in a second layer of coils. In an embodiment, selecting the coil comprises determining that an amplitude of the respective second signal of the selected coil is less than a threshold voltage. In an embodiment, the respective first signal applied to the selected coil generates a signal strength at a coil of the electronic device that exceeds a signal strength threshold. In an embodiment, applying the respective first signal to the first terminal of each of one or more litz coils and each of one or more PCB coils comprises applying the respective first signal to the first terminal of each of one or more litz coils followed by applying the respective first signal to the first terminal of each of one or more PCB coils. In an embodiment, applying the respective first signal to the first terminal of each of one or more litz coils and each of one or more PCB coils comprises interleaving application of the respective first signal to the first terminal of each of one or more litz coils and application of the respective first signal to the first terminal of each of one or more PCB coils. In an embodiment, a set of coils is associated with a foreign object; and wherein applying the respective first signal to the first terminal of each of one or more litz coils and each of one or more PCB coils comprises applying the respective first signal to the first terminal of each of one or more litz coils and each of one or more PCB coils not in the set of coils associated with the foreign object.

In another embodiment, a system is disclosed. The system comprises one or more litz coils and one or more PCB coils; an bridge circuit arranged to apply a respective first signal to a first terminal of each of the one or more litz coils and each of the one or more PCB coils; a controller arranged to: receive a respective second signal from a second terminal associated with each of the one or more litz coils and the one or more PCB coils based on the respective first signal applied to the first terminal of each of the one or more litz coils and each of the one or more PCB coils; select a coil of the one or more litz coils and the one or more PCB coils based on the received respective second signal from the second terminal associated with one or more of the one or more litz coils and the one or more PCB coils; and cause the selected coil to wirelessly transfer the power to the electronic device. In an embodiment, the one or more PCB coils comprises PCB coils in a plurality of layers and a number of turns associated with PCB coils in one layer and a number of turns associated with PCB coils in another layer are different. In an embodiment, the one or more litz coils comprise overlapping litz coils. In an embodiment, the one or more PCB coils comprises PCB coils in a plurality of layers above the one or more litz coils which comprise overlapping litz coils. In an embodiment, the PCB coils are hexagonal PCB coils arranged adjacent to each other.

In yet another embodiment, a system is disclosed. The system comprises one or more multi-strand wire coils and one or more PCB coils; an bridge circuit arranged to apply a respective first signal to a first terminal of each of the one or more multi-strand wire coils and each of the one or more PCB coils; a controller arranged to: receive a respective second signal from a second terminal associated with each of the one or more multi-strand wire coils and the one or more PCB coils based on the respective first signal applied to the first terminal of each of the one or more multi-strand wire coils and each of the one or more PCB coils; determine whether the electronic device is a first device or a second device; select a coil of the one or more multi-strand wire coils based on the received respective second signal from the second terminal associated with one or more of the one or more multi-strand wire coils and the determination that the electronic device is the first device, wherein the first device has a receiver coil which is larger than a receiver coil of the second device; select a coil of the one or more PCB coils based on the received respective second signal from the second terminal associated with one or more of the one or more PCB coils and the determination that the electronic device is the second device; and cause the selected coil to wirelessly transfer the power to the electronic device. In an embodiment, the bridge circuit is further arranged to apply a respective first signal to the first terminal of each of a subset of the one or more multi-strand wire coils and a subset of each of the one or more PCB coils, wherein the subsets define coils previously determined to be proximate to the electronic device; and wherein the controller is further arranged to select a coil in the subset of the one or more multi-strand wire coils based on the received respective second signal from the second terminal associated with the coils in the subset of the one or more multi-strand wire coils. In an embodiment, the one or more multi-strand wire coils comprise overlapping multi-strand wire coils. In an embodiment, the one or more PCB coils comprises PCB coils in a plurality of layers above the one or more multi-strand wire coils. In an embodiment, a foreign object which is not an electronic device is further located on a transmitter pad comprising the one or more multi-strand wire coils and the one or more PCB coils, the system further comprising the controller arranged to not receive the response to the query, and not cause any coil to wirelessly transfer power based on not receiving the response to the query. In an embodiment, the controller arranged to determine whether the electronic device is the first device or the second device comprises determining a number of PCB coils with respective second signals which are less than a first threshold and comparing the number to a second threshold, wherein the number greater than the second threshold indicates the electronic device is the first device.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof: including potentially a program operable to cause one or more data processing apparatus such as a processor to perform the operations described (such as a program encoded in a non-transitory computer-readable medium, which can be a memory device, a storage device, a machine-readable storage substrate, or other physical, machine readable medium, or a combination of one or more of them).

While this specification contains many specifics, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

Other implementations fall within the scope of the following claims.

What is claimed is:

1. A method for wirelessly transferring power to an electronic device, the method comprising:

applying a respective first signal to a first terminal of each of one or more litz coils and each of one or more printed circuit board (PCB) coils;
receiving a respective second signal from a second terminal associated with each of the one or more litz coils and the one or more PCB coils based on the respective first signal applied to the first terminal of each of the one or more litz coils and each of the one or more PCB coils;
selecting a coil of the one or more litz coils and the one or more PCB coils based on the received respective second signal from the second terminal associated with one or more of the one or more litz coils and the one or more PCB coils; and causing the selected coil to wirelessly transfer the power to the electronic device, wherein selecting the coil comprises determining that an amplitude of the respective second signal of the selected coil is less than a threshold voltage.

2. The method of claim 1, further comprising sending a query to the electronic device to request an indication of a type of the electronic device and receiving a response to the query indicating the type of the electronic device; and wherein selecting the coil of the one or more litz coils and the one or more PCB coils comprises selecting the coil based on the type of the electronic device.

3. The method of claim 2, wherein selecting the coil comprises selecting a litz coil of the one or more litz coils as the selected coil based the type of the electronic device being a handheld wireless phone and selecting a PCB coil of the one or more PCB coils as the selected coil based the type of the electronic device being a wearable device.

4. The method of claim 1, wherein a foreign object is further located on a transmitter pad comprising the one or more litz coils and the one or more PCB coils, the method further comprises performing a query for a type of the electronic device, not receiving a response to the query, and not causing any coil to wirelessly transfer power based on not receiving the response to the query.

5. The method of claim 1, wherein applying the respective first signal comprises applying the respective first signal to one coil of a first set of the one or more PCB coils in a first layer of coils followed by applying the respective first signal to one coil of a second set of the one or more PCB coils in a second layer of coils.

6. The method of claim 1, wherein the respective first signal applied to the selected coil generates a signal strength at a coil of the electronic device that exceeds a signal strength threshold.

7. The method of claim 1, wherein applying the respective first signal to the first terminal of each of one or more litz coils and each of one or more PCB coils comprises applying the respective first signal to the first terminal of each of one or more litz coils followed by applying the respective first signal to the first terminal of each of one or more PCB coils.

8. The method of claim 1, wherein applying the respective first signal to the first terminal of each of one or more litz coils and each of one or more PCB coils comprises interleaving application of the respective first signal to the first terminal of each of one or more litz coils and application of the respective first signal to the first terminal of each of one or more PCB coils.

9. The method of claim 1, wherein a set of coils is associated with a foreign object; and wherein applying the respective first signal to the first terminal of each of one or more litz coils and each of one or more PCB coils comprises applying the respective first signal to the first terminal of each of one or more litz coils and each of one or more PCB coils not in the set of coils associated with the foreign object.

10. A system comprising:
one or more litz coils and one or more PCB coils;
a bridge circuit arranged to apply a respective first signal to a first terminal of each of the one or more litz coils and each of the one or more PCB coils;
a controller arranged to:
receive a respective second signal from a second terminal associated with each of the one or more litz coils and the one or more PCB coils based on the respective first signal applied to the first terminal of each of the one or more litz coils and each of the one or more PCB coils;
select a coil of the one or more litz coils and the one or more PCB coils based on the received respective second signal from the second terminal associated with one or more of the one or more litz coils and the one or more PCB coils, wherein the coil is selected based on determining that an amplitude of the respective second signal of the selected coil is less than a threshold voltage; and
cause the selected coil to wirelessly transfer the power to the electronic device.

11. The system of claim 10, wherein the one or more PCB coils comprises PCB coils in a plurality of layers and a number of turns associated with PCB coils in one layer and a number of turns associated with PCB coils in another layer are different.

12. The system of claim 10, wherein the one or more litz coils comprise overlapping litz coils.

13. The system of claim 12, wherein the one or more PCB coils comprises PCB coils in a plurality of layers above the one or more litz coils which comprise overlapping litz coils.

14. The system of claim 13, wherein the PCB coils are hexagonal PCB coils arranged adjacent to each other.

15. A system comprising:
one or more multi-strand wire coils and one or more PCB coils;
a bridge circuit arranged to apply a respective first signal to a first terminal of each of the one or more multi-strand wire coils and each of the one or more PCB coils;
a controller arranged to:
receive a respective second signal from a second terminal associated with each of the one or more multi-strand wire coils and the one or more PCB coils based on the respective first signal applied to the first terminal of each of the one or more multi-strand wire coils and each of the one or more PCB coils;
determine whether the electronic device is a first device or a second device;
select a coil of the one or more multi-strand wire coils based on the received respective second signal from the second terminal associated with one or more of the one or more multi-strand wire coils and the determination that the electronic device is the first device, wherein the first device has a receiver coil which is larger than a receiver coil of the second device;
select a coil of the one or more PCB coils based on the received respective second signal from the second terminal associated with one or more of the one or more PCB coils and the determination that the electronic device is the second device, wherein the coil is selected based on determining that an amplitude of the respective second signal of the selected coil is less than a threshold voltage; and cause the selected coil to wirelessly transfer the power to the electronic device.

16. The system of claim 15, wherein the bridge circuit is further arranged to apply a respective first signal to the first terminal of each of a subset of the one or more multi-strand wire coils and a subset of each of the one or more PCB coils, wherein the subsets define coils previously determined to be proximate to the electronic device; and wherein the controller is further arranged to select a coil in the subset of the one or more multi-strand wire coils based on the received respective second signal from the second terminal associated with the coils in the subset of the one or more multi-strand wire coils.

17. The system of claim 15, wherein the one or more multi-strand wire coils comprise overlapping multi-strand wire coils.

18. The system of claim 15, wherein the controller arranged to determine whether the electronic device is the first device or the second device comprises determining a number of PCB coils with respective second signals which are less than a first threshold and comparing the number to a second threshold, wherein the number greater than the second threshold indicates the electronic device is the first device.

19. The system of claim 15, wherein a foreign object which is not an electronic device is further located on a transmitter pad comprising the one or more multi-strand wire coils and the one or more PCB coils, the system further comprising the controller arranged to not receive the response to the query, and not cause any coil to wirelessly transfer power based on not receiving the response to the query.

* * * * *